United States Patent [19]
Wegeng et al.

[11] Patent Number: 5,811,062
[45] Date of Patent: *Sep. 22, 1998

[54] MICROCOMPONENT CHEMICAL PROCESS SHEET ARCHITECTURE

[75] Inventors: Robert S. Wegeng; M. Kevin Drost, both of Richland; Charles J. Call, Pasco; Joseph G. Birmingham; Carolyn Evans McDonald, both of Richland; Dean E. Kurath, Benton County; Michele Friedrich, Prosser, all of Wash.

[73] Assignee: Battelle Memorial Institute, Richland, Wash.

[*] Notice: The term of this patent shall not extend beyond the expiration date of Pat. No. 5,611,214.

[21] Appl. No.: 606,155

[22] Filed: Feb. 23, 1996

Related U.S. Application Data

[63] Continuation-in-part of Ser. No. 546,329, Oct. 20, 1995, abandoned, which is a continuation-in-part of Ser. No. 282,663, Jul. 29, 1994, Pat. No. 5,611,214.

[51] Int. Cl.[6] ................................................ B01J 10/02
[52] U.S. Cl. ......................................................... 422/129
[58] Field of Search ........................... 165/185; 361/700; 62/498, 115, 51.1 R; 422/50, 130, 179; 428/40, 41, 53, 166

[56] References Cited

U.S. PATENT DOCUMENTS

| | | | |
|---|---|---|---|
| 3,797,202 | 3/1974 | Neulander et al. | 55/158 |
| 4,386,505 | 6/1983 | Little | 62/514 R |
| 4,392,362 | 7/1983 | Little | 62/514 R |
| 4,516,632 | 5/1985 | Swift et al. | 165/167 |
| 5,016,707 | 5/1991 | Nguyen | 165/167 |
| 5,209,906 | 5/1993 | Watkins et al. | 422/200 |
| 5,230,866 | 7/1993 | Shartle et al. | 422/103 |
| 5,296,775 | 3/1994 | Cronin et al. | 310/309 |
| 5,385,712 | 1/1995 | Sprunk | 422/190 |
| 5,534,328 | 7/1996 | Ashmead et al. | 428/166 |

FOREIGN PATENT DOCUMENTS

| | | | |
|---|---|---|---|
| 3926466 A1 | 2/1991 | Germany | B01J 19/24 |

*Primary Examiner*—Timothy McMahon
*Attorney, Agent, or Firm*—Paul W. Zimmerman

[57] ABSTRACT

The invention is a microcomponent sheet architecture wherein macroscale unit processes are performed by microscale components. The sheet architecture may be a single laminate with a plurality of separate microcomponent sections or the sheet architecture may be a plurality of laminates with one or more microcomponent sections on each laminate. Each microcomponent or plurality of like microcomponents perform at least one chemical process unit operation. A first laminate having a plurality of like first microcomponents is combined with at least a second laminate having a plurality of like second microcomponents thereby combining at least two unit operations to achieve a system operation.

41 Claims, 15 Drawing Sheets

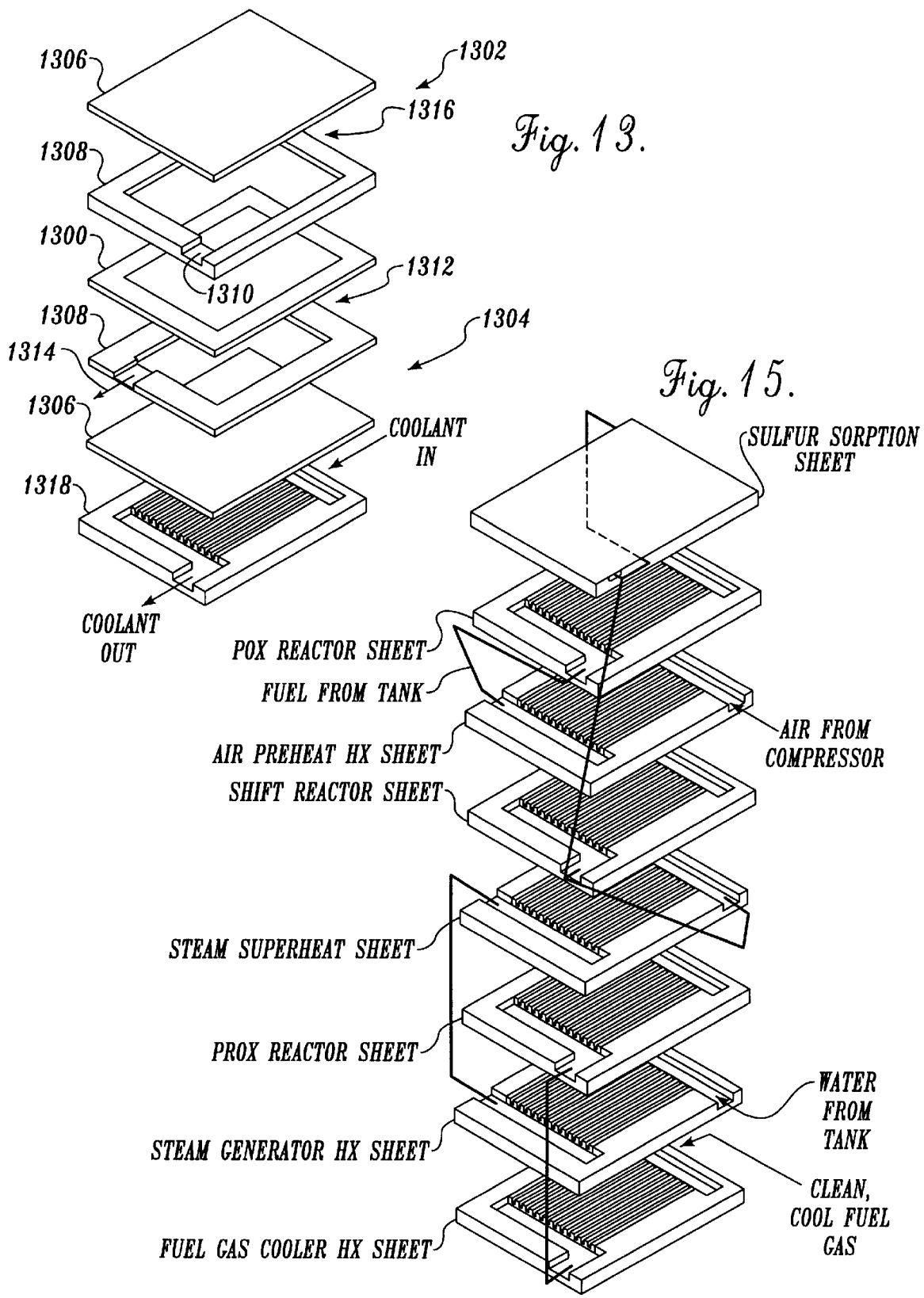

MICROCOMPONENT CHEMICAL PROCESS SHEET ARCHITECTURE

This application is a continuation-in-part of application Ser. No. 08/546,329 filed on Oct. 20, 1995, now abandoned which is a continuation-in-part of Ser. No. 08/282,663 filed Jul. 29, 1994, now U.S. Pat. No. 5,611,214.

This invention was made with Government support under Contract DE-AC06-76RLO 1830 awarded by the U.S. Department of Energy. The Government has certain rights in the invention.

FIELD OF THE INVENTION

The present invention relates generally to an apparatus and method for accomplishing heat transfer and/or power conversion, or chemical process including conversions and separations. More specifically, the invention is a microcomponent sheet architecture wherein macroscale production is achieved with a plurality of microscale elements operating in parallel.

BACKGROUND OF THE INVENTION

In order to continually improve physical standards of living for greater numbers of people, it is necessary to achieve more results with fewer resources. From the industrial revolution through the present, economies of scale have resulted in very large components and systems of capital equipment and central operating facilities. Central facilities have the further disadvantage of requiring distribution systems which have their own capital costs and efficiency losses. Nevertheless, historically, central systems have exhibited cost advantages that supported their use. Smaller distributed components and systems are made having higher unit costs and used in applications where the substantial capital cost of a larger, more efficient component or system is not justified. Thus, there is a need for components and systems that can be made of a size appropriate for the desired capacity and can avoid the need for a distribution system yet achieve the efficiency of the larger scale components and systems.

Components exhibiting high efficiency at small scale include microchannel heat exchangers used to remove heat from electronic components.

U.S. Pat. No. 5,115,858, May 26, 1992, MICROCHANNEL WAFER COOLING CHUCK, Fitch et al. discusses a 3M microchannel stock used to cool a wafer by passing a liquid coolant through alternate channels. A high heat transfer fluid is passed through the remaining channels to remove the heat.

U.S. Pat. No. 4,998,580, Mar. 12, 1991, CONDENSER WITH SMALL HYDRAULIC DIAMETER FLOW PATH, Guntly et al. shows a condenser for use in air conditioning or refrigeration systems. Construction of the condenser is corrugated metal and flat strips.

U.S. Pat. No. 5,016,707, May 21, 1991, MULTI-PASS CROSSFLOW JET IMPINGEMENT HEAT EXCHANGER, Nguyen describes a crossflow heat exchanger and a construction thereof by stacking multiple core and spacer plates.

U.S. Pat. No. 5,296,775, Mar. 22, 1994, COOLING MICROFAN ARRANGEMENTS AND PROCESS, Cronin et al. discusses a micro electronic cooling fan in combination with ridges or fins, e.g., open channels.

The art as shown in the above referenced patents teaches design of specific heat exchange equipment requiring substantial fabrication for individual pieces of heat exchange equipment. Use of this equipment for medium to large scale operations would require the fabrication of multiple heat exchangers wherein the cost increases linearly with the number of heat exchangers.

Moreover, fabrication of a system is considered complicated and expensive on a microscale. Although it is presently possible to make microscale motors, for example, conventional wisdom combines microscale components in series with the result that achieving a macroscale result would require enormous effort and cost of making millions of tiny systems.

Thus, there is a need for a heat exchanger, as well as other system components, and a fabrication technique that permits fabrication of a necessary number of heat exchangers and other components for an application wherein the unit cost per component is sufficiently low that extension to multiple components is achieved with much less cost, and wherein combination of components to form systems for macroscale results is also achieved with low cost.

It has long been a challenge to utilize methane for anything other than burning. It is known that methane can produce hydrogen (Hickman and Schmidt, "Production of Syngas by Direct Catalytic Oxidation of Methane", Science, Vol. 259, Jan. 15, 1993) by using partial oxidation, but that has only been achieved on a small scale with laboratory methods that have yet to be scaled up to useful production quantities. Hydrogen is also produced by steam reforming which requires large capital intensive plants and equipment to be cost effective. Hence, there is still a need for an apparatus and method to produce hydrogen from methane without large capital expense Further, extracting heat from combustion processes results in thermal inefficiency because of the necessary separation of combustion reactants and products from the medium to be heated, for example steam in a coal fired power plant. It has long been desired to reduce thermal inefficiency of combustion heat transfer.

In addition to chemical conversions, chemical separations are also subject to inefficiencies that limit product yield. More specifically, product purity is related to the number of separation stages which is limited by the capital expenditure for each stage.

In a process wherein conversion requires temperature control, very often temperature control is achieved by excess reactant(s) or diluent(s). Hence the temperature control problem is shifted to a downstream separation problem for separating product from unreacted reactant(s) or diluent(s) and/or recovering unreacted reactant(s). Hence there is a need for a method or apparatus permitting conversions requiring temperature control to be carried out without the need for excess reactant(s) or diluent(s).

SUMMARY OF THE INVENTION

The invention is a microcomponent sheet architecture for example, laminate having microchannels. The sheet architecture may be a single laminate with a plurality of separate microcomponent sections or the sheet architecture may be a plurality of laminates with one or more microcomponent sections on each laminate. The microcomponents include passive microcomponents, for example micro flow paths, and active components including but not limited to micropumps and microcompressors.

Each microcomponent or plurality of like microcomponents perform at least one unit operation. A first laminate having a plurality of like first microcomponents is combined with at least a second laminate having a plurality of like second microcomponents thereby combining at least two unit operations to achieve a system operation. For, example, a laminate containing a plurality of microchannel evaporators is combined with an insulating laminate and a laminate containing a plurality of microchannel condensers, and connected to a compressor and expansion valve to obtain a macroscale heat pump.

It is an object of the present invention to provide a laminate that is useful for condensers, heat exchangers, and other components of heat transfer and/or power systems, or chemical process systems.

It is a further object of the present invention to provide a laminate wherein the cost of fabrication is substantially independent of the number of microcomponents formed thereon.

It is a yet further object of the present invention to provide a laminate that is useful for chemical processes including chemical conversions and separations.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

BRIEF DESCRIPTION OF THE DRAWINGS

FIG. 13 is an exploded view of a microporous contactor unit.

FIG. 15 is an exploded view of a fuel processing unit.

DESCRIPTION OF THE PREFERRED EMBODIMENT(S)

The invention is a microcomponent sheet or laminate architecture of individual laminates wherein the fundamental structure is a laminate or laminate portion having tens to millions of microcomponents, preferably hundreds to millions, thereby enabling a laminate to provide macroscale unit operation, for example a condenser having a capacity in the $kW_{th}$ range, and the laminates connected, thereby combining unit operations, to form an assembly, or system, for example a heat pump, or chemical reactor.

FUNDAMENTAL STRUCTURE

Figure 1:
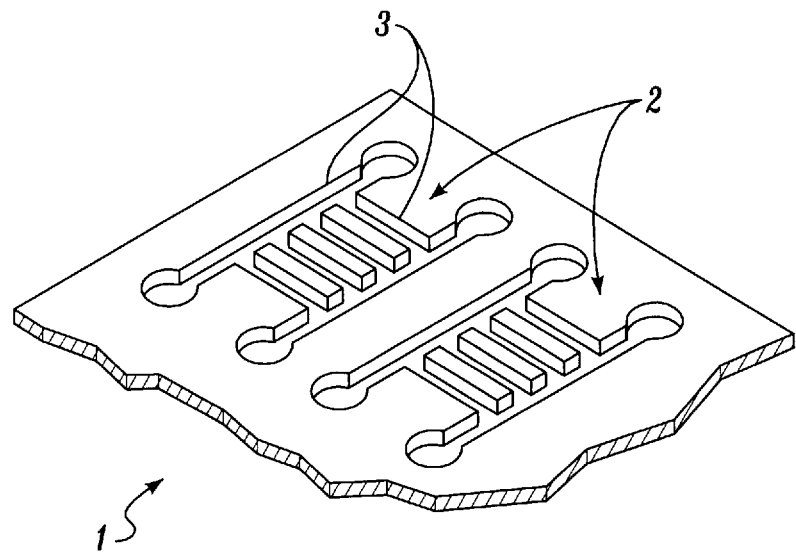
FIG. 1 is an exploded view of a portion of a microscale component laminate with laterally closed lands.

FIG. 1 shows the fundamental structure of a laminate. On a material sheet or laminate 1, a plurality of microcomponents 2 are embedded onto the material sheet 1. Material sheets 1 may be any solid material, but are preferably metal, ceramic, or semiconductor material. A material sheet 1 embedded with microcomponents 2 is a laminate. A laminate is also a material sheet 1 having no microcomponents or having conduits through the material sheet 1 thickness serving as a spacer or insulator.

The microcomponents 2 can be condensers, evaporators or non-phase change heat exchangers, compressors, expansion valves, or motors. It is to be understood that while the drawings and discussion thereof are limited to specific embodiments, there is practically no limit to the types and numbers of microcomponents and combinations thereof that may be included on a laminate or material sheet 1.

Although FIG. 1 depicts microcomponents 2 on one side of the material sheet 1, microcomponents may be embedded on both sides of the material sheet 1. Embedding on both sides may be particularly advantageous for dual fluid heat exchangers, for example feedwater preheating with condensed turbine exhaust.

The density of microcomponents 2 on a material sheet may range from about 1 microcomponent per square centimeter to about $10^{10}$ microcomponents per square centimeter. Within those density ranges, a range of unit lengths or unit diameters of microcomponents 2 is from about 1 micron to about 1 centimeter. The width W of the grooves or microchannels 3 may range from about 1 micron to about 1 millimeter and preferably range from about 10 microns to about 250 microns.

Figure 1A:
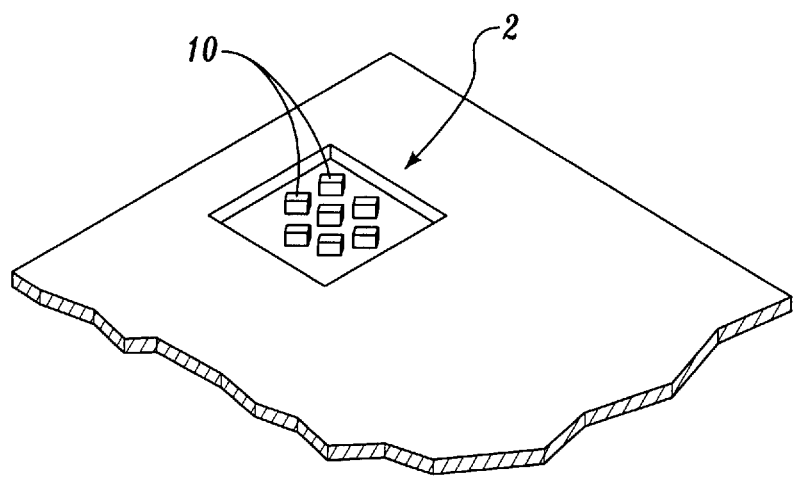
FIG. 1a is an exploded view of a portion of a microscale component laminate with laterally open lands.

The microchannels or flow paths may be laterally closed as shown in FIG. 1, or laterally open as shown in FIG 1a.

Figure 2A:
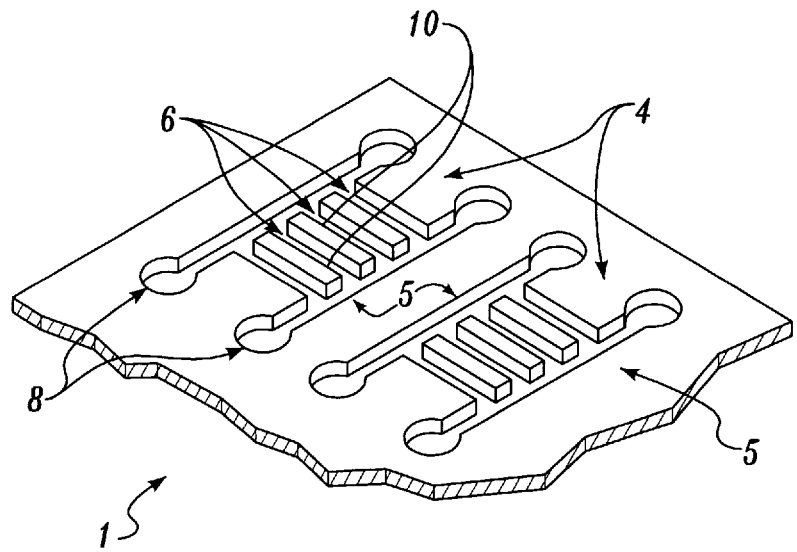
FIG. 2a is an exploded view of a portion of a microscale component laminate with connections on header ends.
Figure 2B:
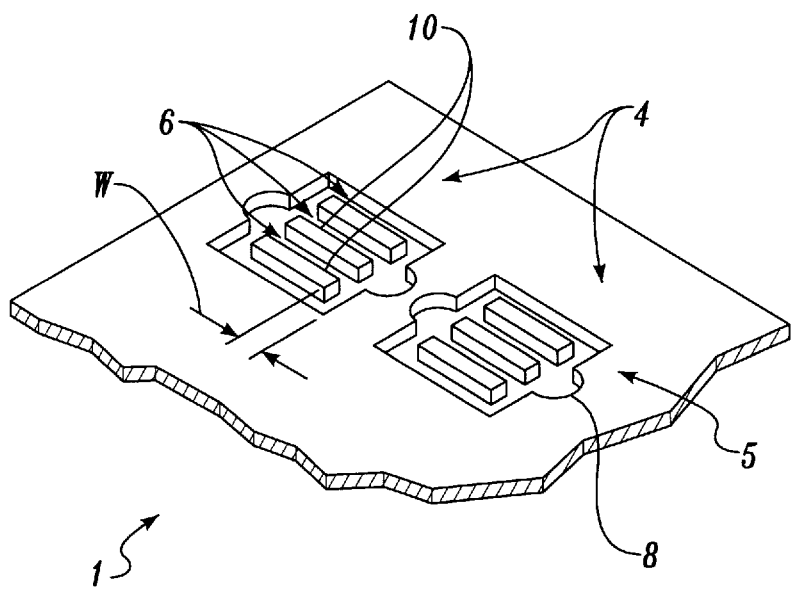
FIG. 2b is an exploded view of a portion of a microscale component laminate with connections along header length.

In FIGS. 2a and 2b, the microcomponents 2 are groove sets 4 made up of a pair of headers 5 and laterals 6. Laterals 6 are the grooves permitting flow between header pairs 5. Laterals 6 are shown substantially perpendicular to headers 5, but is will be apparent to one skilled in the art of microcomponents that a lateral 6 can form an angle other than 90 degrees with a header 5. Headers 5, may be provided with connections 8, which are enlarged portions of headers 5, for receiving and sending fluid. The connections 8 are optional inasmuch as fluid transfer to and from the headers 5 can be accomplished within the width W of the headers 5. Laterals 6 may have the same width as the headers 5 or have a different width either smaller or larger. It is preferred that the laterals 6 have smaller widths than the headers 5.

Embedment of microcomponents 2 or groove sets 4 may be accomplished by any microchannel forming process, but is preferably done with micromachining or photolithography. A photolithographic process is most preferred because the cost of making groove sets 4 is substantially independent of the number of groove sets 4. Microchannel forming processes generally etch a surface so that resulting channels are unconfined on the etched side. Channels are closed by bonding a second laminate to the etched surface. The plurality of solid material lands 10 defining the laterals 6 function as heat transfer fins supporting the high heat flux observed. Each land 10 may be laterally closed as shown in FIG. 2a or laterally open as shown in FIG. 1a to permit cross flow communication. The lands 10 may be of any cross section including but not limited to rectangular, rhomboid, and ellipsoid cross sections. Laterally open lands increase flow area thereby reducing the possibility of clogging and reducing the effect of a clog should it occur. In microcomponents with laterally open lands, the definition of a lateral is less distinct especially if the lands are offset or randomly spaced. Nevertheless, the spaces between the open lands are flow paths.

Although the microcomponents 3 are shown without a top cover, it is preferred that the top be closed with a cover to constrain the flow of fluid to remain within the flow paths and in intimate contact with the lands 10. The cover may be a plain laminate having no microcompon-ents, for example an insulating laminate, or it may be another microcomponent laminate.

SYSTEMS

A single microcomponent or a set of like microcomponents is capable of performing at least one unit operation. A unit operation is defined as an operation that changes the state (thermodynamic state including chemical and/or physical state) of a working fluid including but not limited to condensation, evaporation, compression, pumping, heat exchanging, expansion, or chemical process, for example chemical conversion or separation. Chemical reactions may be endothermic or exothermic. Conversion reactions include, for example, partial oxidation and combustion. Separation involves receiving at least one chemical mixture having a chemical product and a product carrier and separating the chemical product from the product carrier. Examples of separations include distillation, ion exchange and solvent extraction. A collection of unit operations is a system. An example of a single microcomponent performing more than one unit operation is a microcompressor in a thermally conductive material performing both compression and heat transfer simultaneously. Of course macrocompressors conduct heat as a result of compressing a gas, but that heat is small compared to the process heat, for example heat removed from a refrigerated space. The distinct advantage of a microcomponent is that the heat transferred simultaneous with the compression is indeed process heat thereby providing a substantially constant temperature compression (approaching an ideal isothermal compression) which results in the most efficient energy transfer/conversion. A further example of a system is a microchannel combustor placed upon a microchannel evaporator for vaporizing a working fluid for a heat engine. Yet further, a system may comprise a microchannel chemical reactor placed upon an microchannel heat exchanger, preferably an evaporator, for temperature control of the chemical reaction thereby permitting control of partial oxidation chemical reactions.

In general, a system has a first laminate having a first plurality of microcomponents for performing at least one unit operation; attached to a second laminate having a second plurality of microcomponents for performing at least one additional unit operation;

wherein the unit operation is combined with the additional unit operation and produces a system operation.

Alternatively, instead of having separate unit operations on separate laminates, separate unit operations may be placed on a single laminate having a first portion and at least a second portion. The first portion has first microcomponents for performing a unit operation and the second and subsequent portion(s) have second and subsequent microcomponents for performing another and subsequent unit operation (s). The unit operation is combined with the additional and/or subsequent unit operation(s) and produces a system operation.

Microcomponents performing one unit operation can be combined in several ways with microcomponents performing another unit operation. For example, several microscale pumps in parallel may feed a single heat exchanger, or one microscale pump may feed several heat exchangers in parallel. Similar variations with like microcomponents in series or a combination of series and parallel arrangements may be used advantageously in particular applications.

Laminates or laminate portions are combineable into a wide variety of systems including but not limited to heat pumps, heat engines, heat pipes, thermal sources, and chemical plants, for example chemical converters and chemical separators.

HEAT PUMP

A heat pump of microscale components has the same basic unit operations as a macroscale heat pump. For a vapor compression heat pump the basic unit operations are evaporation, compression, condensation, and expansion. However, the microscale components performing each unit operation are so numerous as to provide the same level of macroscale heating or cooling in terms of thermal kilowatts or megawatts as the macroscale counterpart.

Figure 3A:
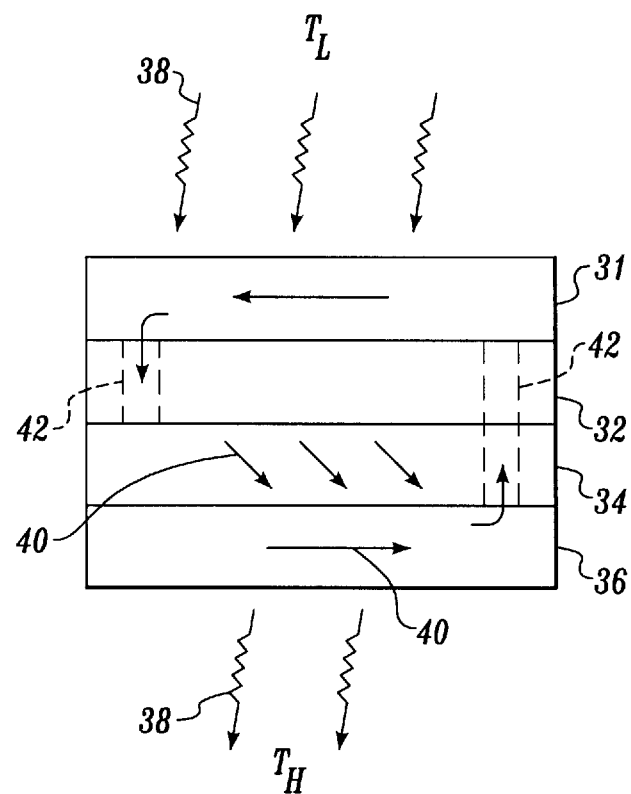
FIG. 3a is a heat pump made of microscale laminates.

A heat pump of microscale components is shown in FIG. 3a, having a microscale evaporator laminate 31, insulation laminate 32, microscale compressor laminate 34, and microscale condenser laminate 36. The microscale evaporator laminate 31 and condenser laminate 36 are laminates having groove sets 4 wherein each groove set 4 is a microcomponent. The microscale compressor microcomponent can be a solid piston linear alternator, a piezoelectric diaphragm as described by Smits JG, 1990, "A Piezoelectric micropump With Three Valves Working Peristaltically", *Sensors and Actuators* 15, 153–67, or other micromechanical actuator capable of compressing a gas. Expansion valves or orifices may be etched in the compressor laminate 34, or a separate laminate containing expansion valves may be inserted between the compressor laminate 34 and the insulation laminate 32. The wavy stem arrows 38 outside the laminates indicate the direction of heat transfer from a low temperature $T_L$ to a high temperature $T_H$. The solid stem arrows 40 within the laminates indicate the direction of flow of working fluid. The hidden (dashed or broken) line conduits 42 indicate no fluid contact within that laminate. The conduits 42 may be few as shown or a plurality.

Figure 3B:
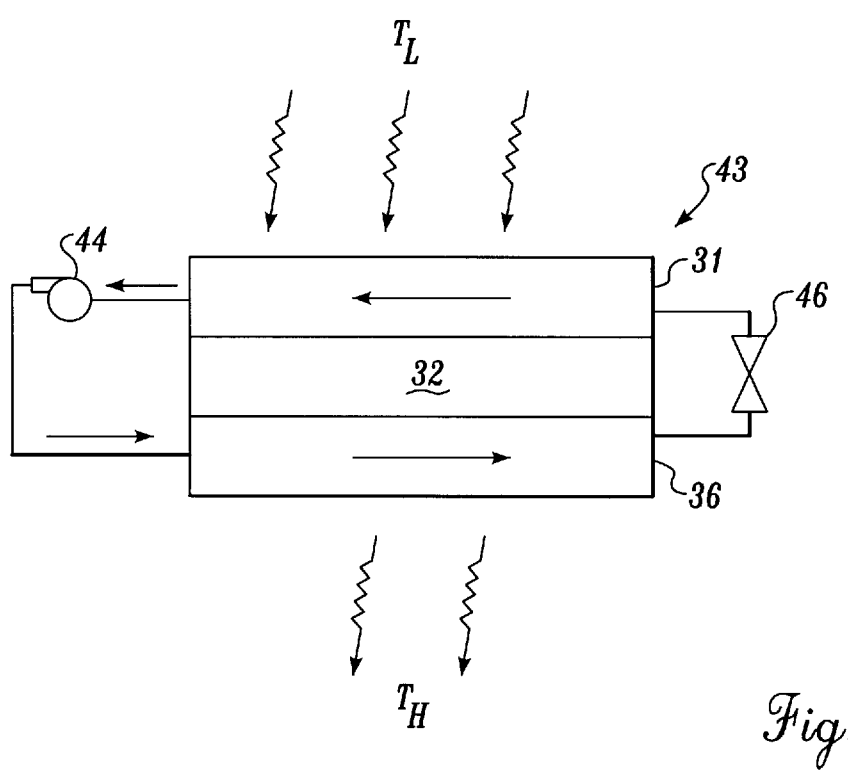
FIG. 3b is a heat pump made of a combination of microscale laminates and macroscale components.

In FIG. 3b, an alternative heat pump embodiment is shown. In this embodiment, the evaporator laminate 31 is placed on the insulation laminate 32 with the condenser laminate 36 on the opposite side of the insulation laminate thereby forming a microcomponent thermal assembly 43. A macroscale compressor 44 and a macroscale expansion valve 46 are mounted externally to the microscale components. It may be noted that in this embodiment, no passages or conduits 42 are needed through the insulation 32.

EXAMPLE 1

Figure 4:
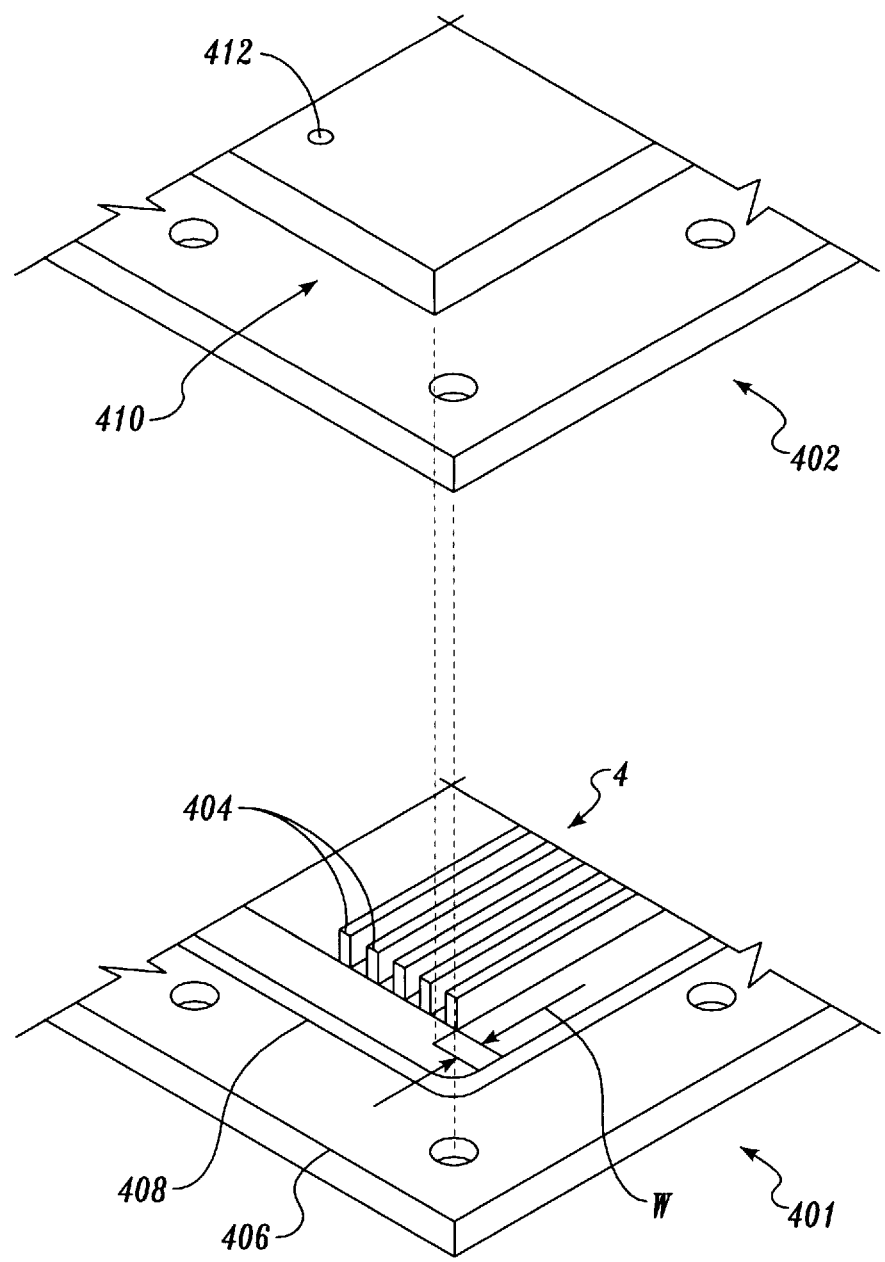
FIG. 4 is an exploded view of a test assembly.

An experiment was conducted to demonstrate operation of microscale condensers and evaporators. A test assembly, shown in FIG. 4, was made having a groove set piece 401 and a manifold 402. Both the groove set piece 401 and the manifold 402 were made from copper. The portion of the groove set piece 401 containing the groove set 4 was about 2.3 cm×2 cm×1 mm and the groove walls 404 extended like fins above a base 406. The groove set 4 contained 48 laterals between pairs of groove walls 404. Each lateral was about 260 microns wide and about 1 mm deep. An o-ring groove 408 contained an o-ring (not shown) for sealing between the groove set piece 401 and the manifold 402.

The manifold 402 had a raised roof 410 of stainless steel. The raised roof 410 fit over the groove set 4 leaving little or no space between the top of the groove walls 404 and the undersurface of the raised roof 410. If there was any space at all, it was within a tenth of a millimeter and most likely within 0.01 millimeter. The raised roof 410 is oversized in the direction parallel to the groove walls 404 thereby forming headers on either end of the groove set 4, the headers having a width W. Fitting connection holes 412 were provided in the raised roof 410 for fluid flow through the groove set 4.

The test assembly was operated as a condenser with refrigerant R-124 as the working fluid. Steady state conditions were defined at a pressure of approximately 3 atm with the inlet receiving superheated R-124 at a temperature of about 20° C. and outlet exhausting subcooled liquid R-124. The condenser was placed in an environment of a water/ice bath at a temperature of 0° C. Refrigerant flow rate varied between 0.150 g/s and 0.205 g/s. The change in enthalpy of the incoming superheated R-124 and the exiting condensed liquid R-124 was 155 joules/g which demonstrated that the test assembly achieved a heat transfer rate of from about 6 to about 8 Watts/cm$^2$ for the working area of the heat exchanger.

HEAT PUMP EMBODIMENTS

The previous description and example of microscale components for a heat pump were centered around a vapor compression cycle. Those skilled in the art of heat pumps would know that other thermodynamic cycles, in addition to vapor compression, are used for heat pumps. For example, Reverse Brayton, Stirling Cycle, and Absorption Cycle have been used.

Figure 5A:
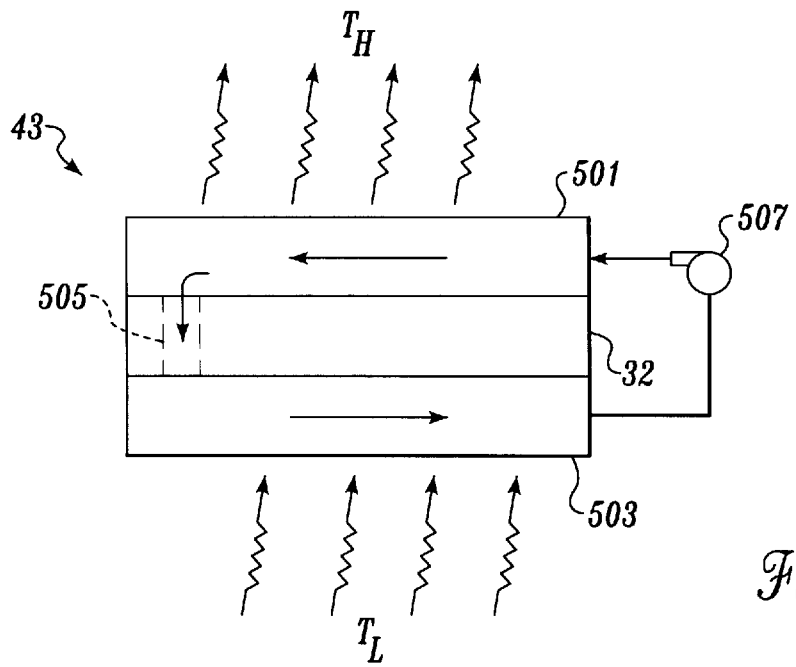
FIG. 5a is a reverse Brayton Cycle heat pump made of a combination of micro and macro scale components.
Figure 5B:
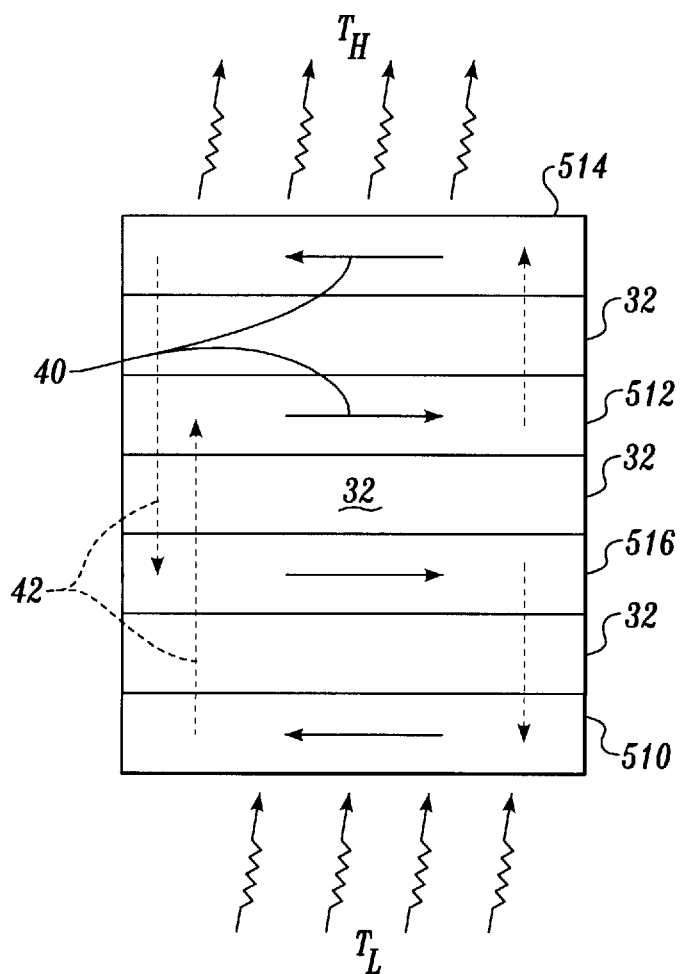
FIG. 5b is a reverse Brayton Cycle heat pump made of microscale components.

FIG. 5a shows a Reverse Brayton heat pump combining microchannel heat exchangers with a macroscale compressor, and FIG. 5b shows a Reverse Brayton heat pump using no macroscale components. In FIG. 5a, the microcomponent thermal assembly 43 is a microchannel heat exchanger rejector 501 having groove sets 4 placed on an insulating laminate 32 with a microchannel heat exchanger receiver 503 placed on the side of the insulating laminate 32 opposite the rejector 501. Expansion valve(s) 505 permit flow from the rejector 501 to the receiver 503. A compressor 507 moves the working fluid through the system.

In FIG. 5b, all unit operations are performed by microcomponents thereby permitting operation approaching an ideal cycle. In FIG. 5b, the receiver 510 is a laminate having microgenerators. In addition, the receiver laminate 510 is made of a thermally conductive material. Because the receiver laminate 510 has microgenerators in combination with a thermally conductive material, the receiver laminate 510 is capable of performing two unit operations simultaneously, namely production of work and receipt of heat which more nearly approaches the ideal isothermal generation or extraction of work. Working fluid leaves the receiver laminate 510 and flows into an isentropic compressor laminate 512, and thence into a rejector laminate 514 having microcompressors in a thermally conductive material for performing simultaneous compression and heat rejection. The working fluid then flows to a generator laminate 516 for isentropic work extraction then back to the receiver laminate 510. Insulation layers 32 are placed between the receiver laminate 510 and the generator laminate 516, between the generator laminate 516 and the compressor laminate 512, and between the compressor laminate 512 and the rejector laminate 514. The broken line conduits 42 indicate fluid passages through various laminates and layers and the solid stem arrows 40 indicate flow of working fluid within a laminate performing at least one unit operation.

It will be apparent to those skilled in the art of Reverse Brayton heat pumps that the combined receiver and rejector laminates 510, 514 can be made of separate compressor and generator laminates and separate heat exchange laminates. However that is less preferred because of the departure from the ideal Reverse Brayton cycle conditions.

HEAT ENGINES

Thermodynamically a heat engine is the reverse of a heat pump. However, practically they are quite different. For example, a heat engine does not use an expansion valve and extracts work from the working fluid. The working fluid may be gas or liquid, but the macroscale heat engine is very different from a macroscale heat pump.

There are numerous thermodynamic cycles upon which even more numerous heat engine designs are based, including but not limited to Rankine Cycle, Brayton Cycle, Stirling Cycle, Otto Cycle, Diesel Cycle, Kalina Cycle, and the Ericcson Cycle. In addition there are combinations or combined cycles and various energy conservation measures. In the Rankine Cycle, for example, reheat, superheat and feedwater preheating have been used alone or in combination in various heat engine applications. All of these cycles are distinct because of the type of working fluid, internal versus external combustion of fuel, and other characteristics well known to skilled practitioners. Nevertheless, all of these thermodynamic cycles and improvements thereto are the result of attempts to approach the performance of the ideal Carnot Cycle.

Use of microscale laminates, especially condensers and evaporators, have the potential of improving the efficiency of these cycles because of their high specific heat transfer rates. Moreover, use of microscale generators, for example electromagnetic actuators driven in reverse, have the possibility of providing completely microscale based heat engine with efficiencies in excess of any other cycle.

Although there are numerous heat engine cycles as mentioned above, it is believed that the following specific descriptions are enabling not only for the specific cycles discussed, but are also enabling for other cycles as well to one skilled in the art of heat engine cycles.

Figure 6A:
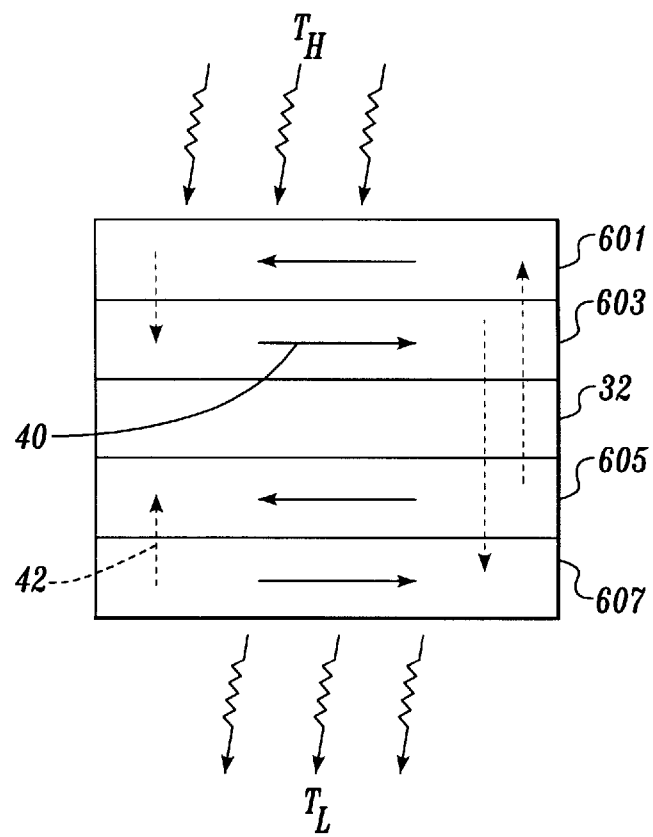
FIG. 6a is a Rankine Cycle heat engine made of microscale components.

FIG. 6a shows a Rankine Cycle heat engine having only microcomponents. An evaporator laminate 601 is placed on a generator laminate 603 on one side of an insulating laminate 32. On the opposite side of the insulating layer 32 is a pump laminate 605 and a condenser laminate 607.

Figure 6B:
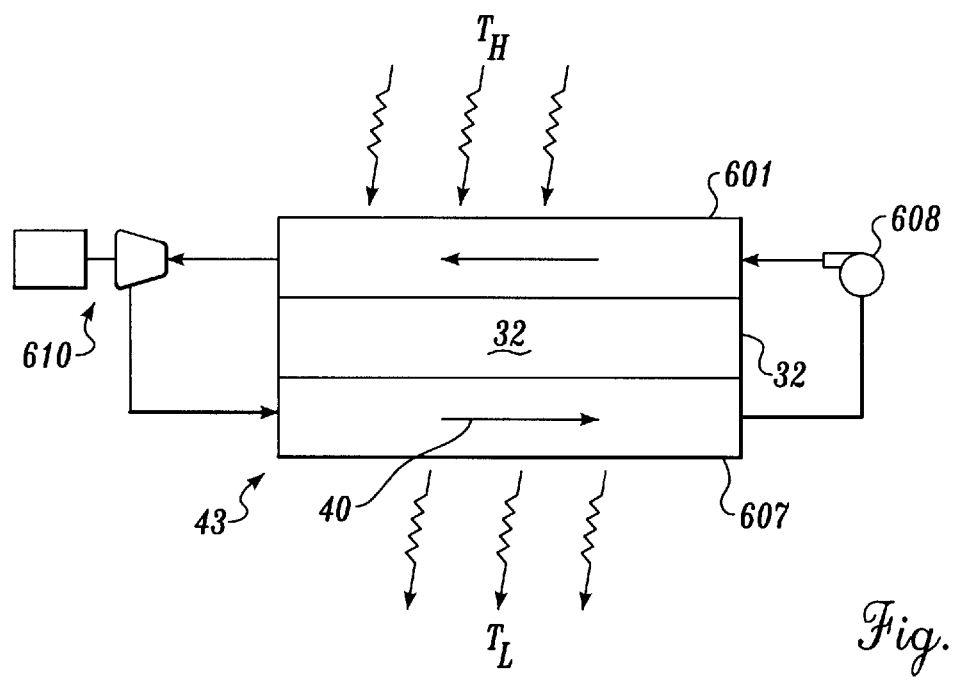
FIG. 6b is a Rankine Cycle heat engine made of a combination of micro and macro scale components.

FIG. 6b shows a Rankine Cycle heat engine having a combination of microcomponents and macrocomponents. The microcomponent thermal assembly 43 is an evaporator laminate 601 placed on one side of an insulating laminate 32 with a condenser laminate 607 on the opposite side of the insulating laminate 32. A pump 608 circulates working fluid from the condenser laminate 607 to the evaporator laminate 601, and a turbine/generator set 610 extracts work from the working fluid and creates electricity.

Figure 7A:
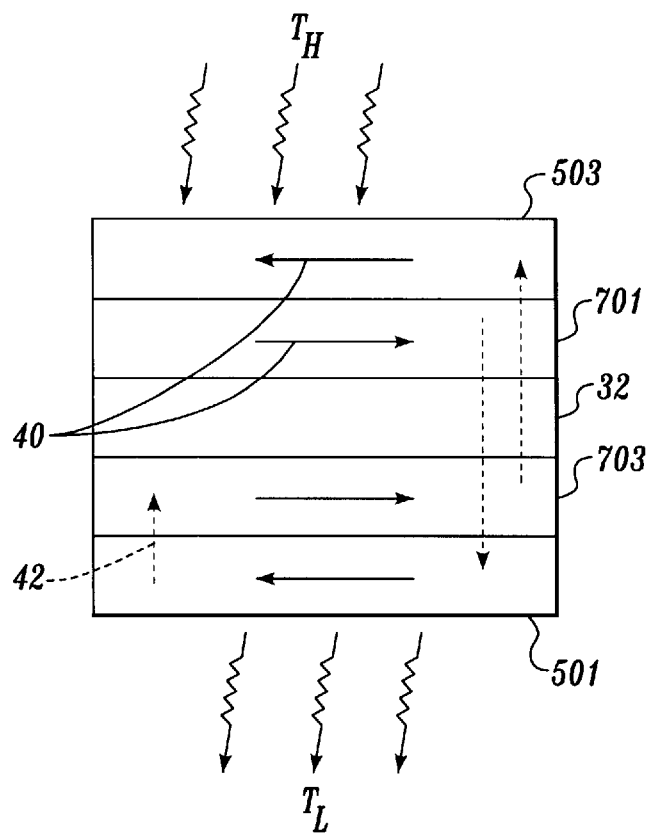
FIG. 7a is a Brayton Cycle heat engine made of microscale components.

FIG. 7a shows a Brayton Cycle heat engine of microcomponents. The two heat exchangers, rejector 501 and receiver 503 may be the same as for the Reverse Brayton cycle previously described. The generator 701 may be similar to the Rankine Cycle generator 603 but with necessary modifications to accommodate a different working fluid. Likewise, the compressor 703 is made compatible with the Brayton Cycle working fluid, usually a gas, for example air.

Figure 7B:
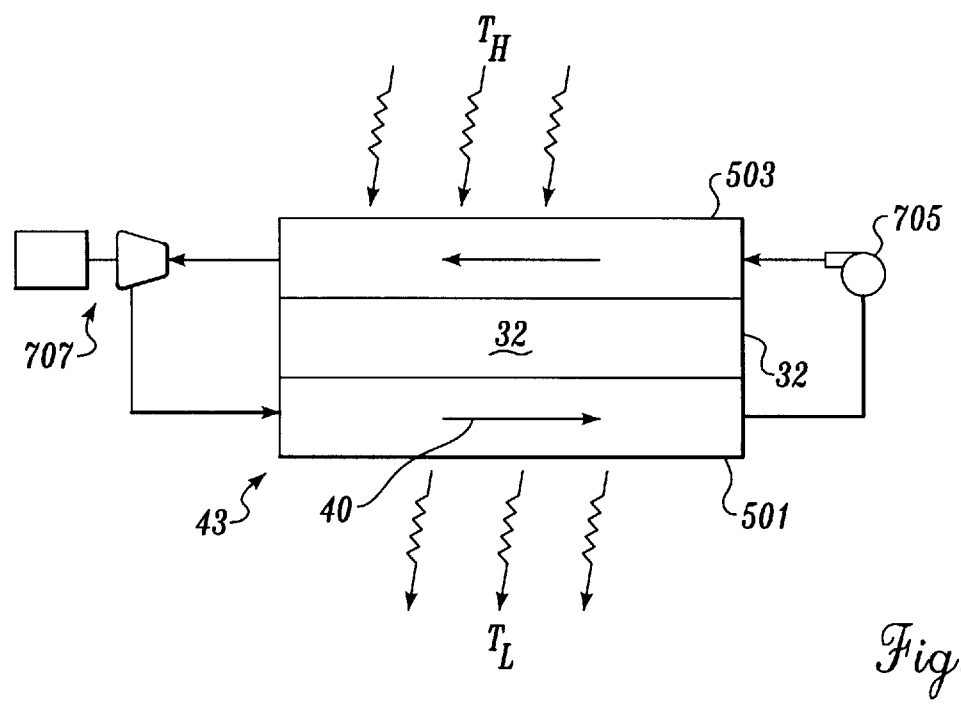
FIG. 7b is a Brayton Cycle heat engine made of a combination of micro and macro scale components.

FIG. 7b shows a Brayton Cycle heat engine having a combination of micro and macro components. The turbine generator set 707 may be similar to the Rankine Cycle turbine generator set 610, but would be specific for handling air or other non-condensible gas rather than steam. Likewise, the compressor 705 and microcomponent thermal assembly 43 would be designed to handle air or other noncondensible gas as the working fluid.

Figure 7C:
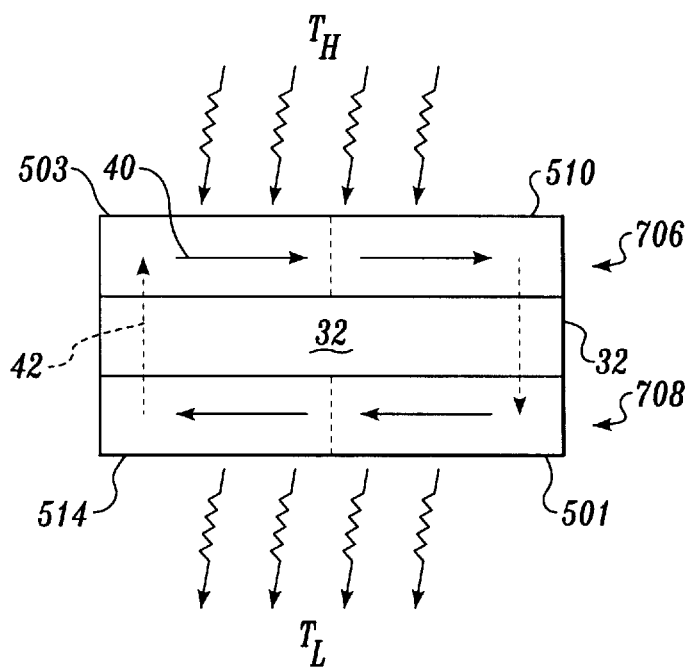
FIG. 7c is an Ericsson Cycle heat engine made of microcomponents.

FIG. 7c shows yet another microcomponent version that approaches an ideal Brayton Cycle, also referred to as the Ericsson Cycle. This embodiment exemplifies a laminate having two unit operations on separate portions of the laminate. Specifically, the receiver laminate 706 has a heat exchanger receiver portion 503 and an isothermal generator portion 510, while the rejector laminate 708 has a heat exchanger rejector portion 501 and an isothermal compressor portion 514.

Distributed production of certain feedstock chemicals, including toxic gases, at their point of use is enabled by the mirocomponent sheet architecture of the present invention. By producing feedstock at the point of use, hazards and expenses of transportation and storage are reduced. Specifically, environmental restoration, particularly groundwater cleanup may involve deployment of a mirocomponent sheet architecture chemical process at depth.

POWER GENERATION SYSTEMS

Figure 8:
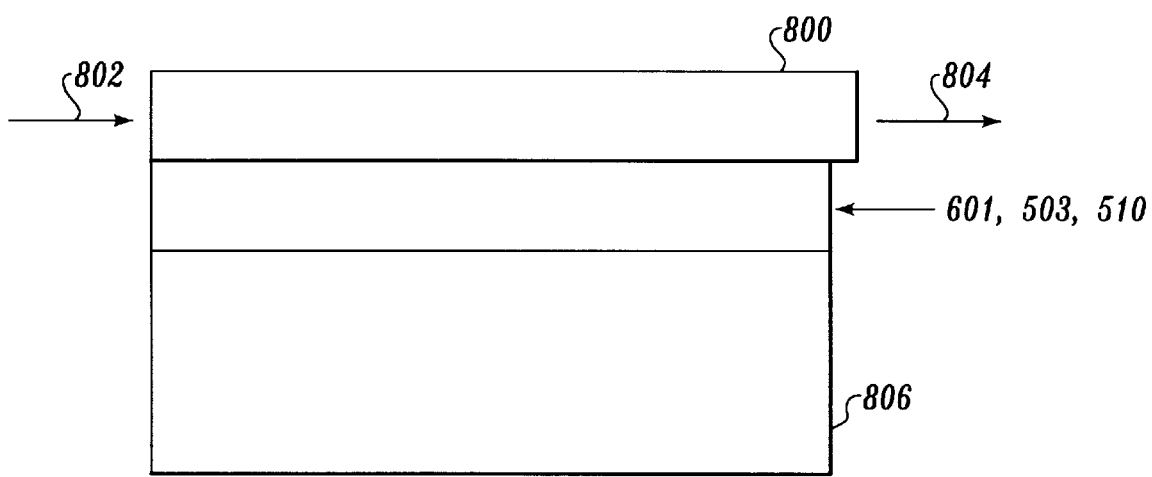
FIG. 8 is a power conversion system.

A power generation system is shown in FIG. 8. A microchannel chemical converter is used as a combustor 800 which receives reactants 802 and rejects products 804. Heat from the combustor 800 is transferred to an evaporator 601 or a receiver 503 or 510, which is connected to the balance of plant 806. The balance of plant 806 contains the necessary components of any of the heat engines previously described.

CHEMICAL PROCESS SYSTEMS

A microchannel chemical process system is one in which a chemical process unit operation is combined with at least one other unit operation. The use of microchannels for chemical processes permits greater control in the process that cannot be obtained in a conventional "macrochannel" large scale reactor. For example, a broad range of control of temperature is made possible by use of microchannel laminates. Specifically, microchannel chemical reactors used in a sheet architecture permit controlled temperature gradients or controlled temperature variation across a sheet of microchannels thereby permitting quenching and attainment of non-equilibrium states. In addition to temperature, other parameters may be closely controlled. Specifically, microchannel geometry is useful for control of residence time, or velocity profile or both. Energy other than thermal energy may be used to activate a reaction or to otherwise create an environment conducive to specific desired reactions, including but not limited to electrical field induced reactions (e.g. plasmas or aqueous phase electrochemical reactors) magnetically induced or controlled chemical reactions and sonically induced reactions. An example of providing a temperature gradient, is having a sheet of parallel microchannels for a condenser or evaporator wherein adjacent microchannels are held at different pressures thereby experiencing phase change at different temperatures. With a reactor sheet having microchannels positioned in crossflow with respect to the condenser or evaporator microchannels, the reactions conditions are controllable along the length of the microchannel reactor.

A field generator is used to induce an electric or magnetic field. The field generator is placed in proximity of the first laminate having reactor microchannels.

The microchannel reactor is preferably used for reactions that do not require materials or solids that would clog the microchannels and that do not produce materials or solids that would clog the microchannels. Because the microchannel sheet architecture is capable of precise and accurate control of localized reaction conditions, for example reaction temperature and temperature gradient control at predetermined reactor location(s), it is preferred that the microchannel sheet architecture be used for reactions wherein precise control is beneficial as in partial oxidation reactions.

Control of reaction temperature is critical for all partial oxidation reactions and control of residence time may be critical depending upon the reaction and reaction conditions. For example, partial oxidation of methane to hydrogen requires both control of temperature and residence time to avoid combustion of methane to carbon dioxide and water. By placing a sheet of microchannels for reaction on a sheet of microchannels for cooling, the reaction temperature is controllable to maximize yield of hydrogen.

Temperature control may be achieved in any of several ways. For example when a first sheet or laminate is in a cross flow relationship to a second sheet or laminate, a temperature gradient along a flow direction of the first laminate is maintained by controlling temperature of coolant within particular microchannels or microcomponents. When two-phase flow is used in the heat transfer sheet or laminate, pressure would be used to control phase change temperature. Alternatively, geometry of the microchannels, e.g. variable flow path width, cross sectional area and/or shape may be used to optimize heat transfer to or from a chemical process sheet or laminate.

Figure 9:
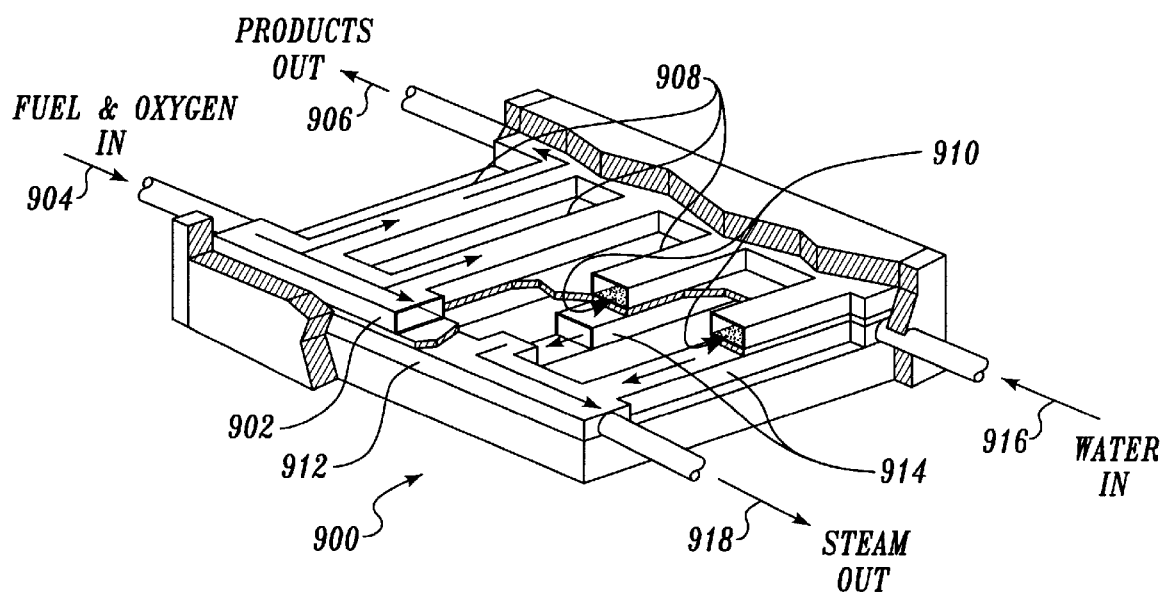
FIG. 9 is a chemical process system.

Referring now to FIG. 9, a microchannel reactor 900 has a first laminate 902 reactor that receives reactants 904, preferably fuel and oxygen, and rejects reaction products 906. The first laminate 902 contains microchannels 908. It is preferred that the microchannels 908 contain a coating 910 on a surface of the microchannels 908. The coating is preferably a catalyst, or a catalyst support with catalyst or multiple catalysts. Alternatively, the coating is a permeate or a material that influences wetability or contact angle coating materials include but are not limited to catalytic metals, for example nickel, platinum, and rhodium. Alternatively, for chemical separations, the coating 910 is a membrane or adsorbent.

A second laminate 912 has microchannels 914 for receiving a liquid 916, preferably water, and rejecting evaporate 918, preferably steam. The phase change from liquid to evaporate is used to control the temperature of reaction in the reaction microchannels 908. For reactions like partial oxidation wherein it is desired to control the reaction temperature, it is preferred that the cooling medium microchannels 912 be in close proximity with reaction microchannels 902. Cooling medium microchannels 912 and reaction microchannels 902 may be in direct contact, or may have a gap therebetween. The gap may be open or filled with an insulating material. For maximum heat transfer, flow of cooling medium with respect to reactants is preferably counterflow, but may be parallel or crossflow.

The evaporate may be used as a working fluid in a heat engine, for example a Rankine cycle. In an alternative embodiment, the reaction may be combustion wherein control of the temperature of combustion is not critical, rather than partial oxidation, and the phase change used solely as a working fluid in a heat engine for producing work. Additionally, a single phase fluid may be used for removing heat wherein no phase change occurs.

Figure 10A:
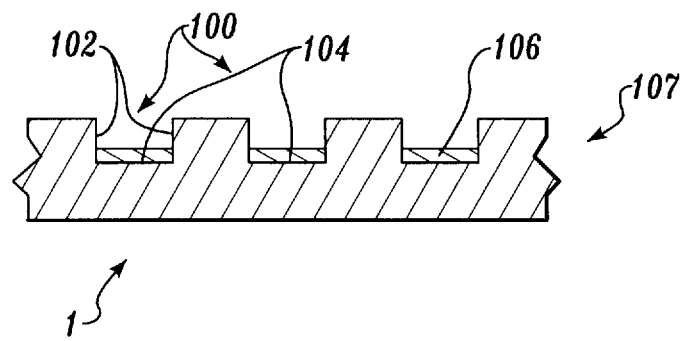
FIG. 10a is a cross section of microchannels having conductive layers therein.
Figure 10B:
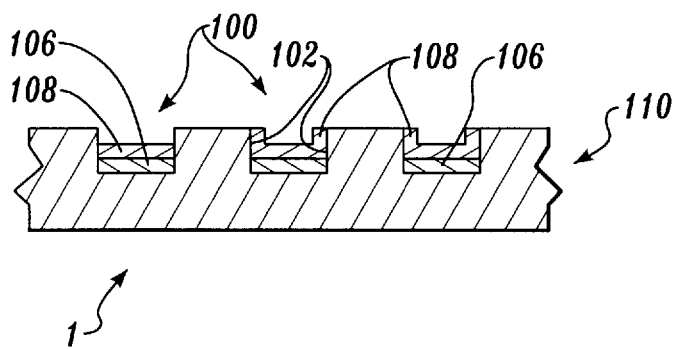
FIG. 10b is a cross section of microchannels having conductive and dielectric layers therein.

Further embodiments useful for electrochemical unit operation are depicted in FIG. 10a and FIG. 10b. In FIG. 10a, the laminate or material sheet 1 having grooves 100 defined by side surfaces 102 and a bottom surface 104, is a nonconductive material, for example a ceramic. On the bottom surface 104 is placed a layer of conductive material 106 thereby forming a conductive grooved sheet 107. Further, as shown in FIG. 10b, a dielectric layer 108 may be placed on the conductive layer 106. It is preferred that the dielectric layer extend to cover the side surfaces 102. A material sheet 1 having a layer of conductive material 106 covered by a dielectric layer 108 forms an insulated conductive groove sheet 110.

Figure 11:
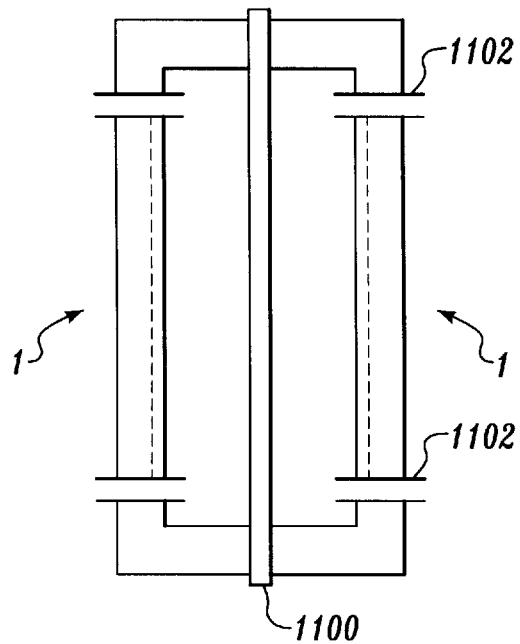
FIG. 11 is a cross section of an embodiment wherein microchannels are separated by a membrane.

The conductive grooved sheets (107 or 110) may be placed spaced apart with grooves facing each other and with a membrane 1100 between them (FIG. 11). When using conductive grooved sheets 107, and with a permeable membrane, operation of an electrochemical cell is permitted. Connectors 1102 serve as electrodes and/or fluid ports, wherein a fluid may be a liquid or gas. An electrical supply (not shown) provides the electrical potential necessary to generate the electrical potential. When using insulated conductive groove sheets 110 with a gas, a low temperature plasma may be generated within the grooves 100, and the low temperature plasma may extend from the grooves 100 toward the membrane 1100. Alternatively, for forming a low temperature plasma, a single insulated conductive groove sheet 110 may be used wherein the membrane 1100 is nonpermeable and acts as a cover. Alternatively, the membrane 1100 may be omitted and a second sheet without grooves may serve as a cover.

For a membrane separated pair of insulated conductive groove sheets 110, it is envisioned that methane and a small amount of oxygen may be introduced into a low temperature plasma on one side of the membrane thereby producing ethylene that is removed and possibly hydrogen that passes through the membrane where it may be combined with nitrogen to produce ammonia. Further, natural gas may be passed through the plasma to form acetylene, ethylene, cyclic propane or a combination thereof.

It is further envisioned that a single chamber insulated conductive groove sheet 110 may be used to destroy volatile organic contaminants (VOC) from industrial processes, for example dry copy machines by passing the VOC laden air through the plasma. Another process is film processing that emits formaldehyde and ammonia that can be destroyed in the plasma to produce breathable air.

EXAMPLE 2

An experiment was conducted with a covered insulated conductive groove sheet 110 to generate a low temperature plasma.

The insulated conductive groove sheet 110 was made from a machineable glass ceramic, Macor. There were two grooves measuring 3/32 inch wide, 1/8 inch deep, and 3½ inch long. In the bottom of each groove was deposited a layer of aluminum metal to a thickness of 5 micron. A layer of dielectric material, alumina ($Al_2O_3$), having a thickness of 5 micron was deposited over the layer of aluminum metal.

Figure 12A:
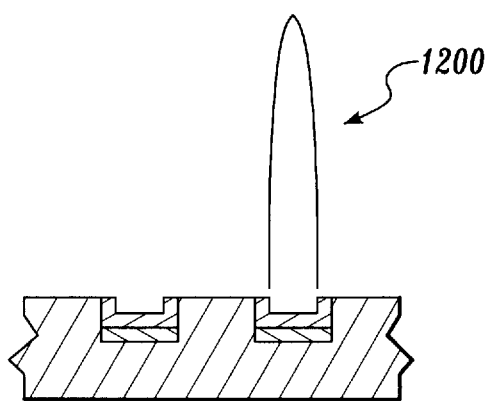
FIG. 12a is a depiction of a plasma produced with low frequency electricity.
Figure 12B:
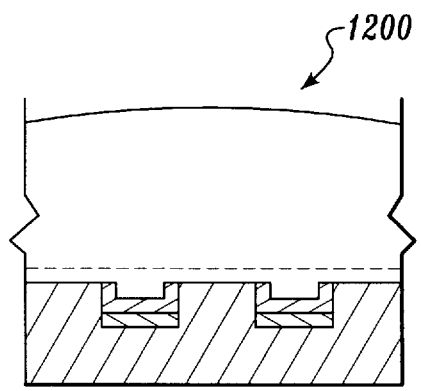
FIG. 12b is a depiction of a plasma produced with high frequency electricity.

Air was passed through the grooves and the cover was aluminum to serve as an electrical ground. Electricity was applied to the aluminum layers as 1.5 kV, 10 milliamp at frequencies from 60 Hz to 25 kHz. Plasmas were observed. At lower frequencies, the plasmas 1200 extended from the grooves like flames as illustrated in FIG. 12a. At higher frequencies, the plasmas 1200 joined and tended to fill the space above the grooves as illustrated in FIG. 12b.

CHEMICAL SEPARATIONS AND CONVERSIONS

Chemical separations as used herein includes any exchange of a compound or element from one solvent to another where the solvents may be liquid or gas or both. An example is an absorption cycle refrigeration system. In chemical separations, a porous membrane is used that is selected so that a first solvent containing the element or compound does not wet the porous membrane but a second solvent wets the porous membrane and the element or compound in the first solvent transfers to the second solvent and through the porous membrane.

By making the depths of the solvents small, i.e. less than about 100 micron, higher absorption rates are achieved than with larger depths. A microporous contactor unit is a microporous contactor sheet placed between cover sheets. Each cover sheet has a microplenum or at least one microcomponent together with an inlet and an outlet permitting fluid flow across the microporous contactor sheet.

In most practical systems, to achieve high absorption/desorption rates, heat will need to be transferred either to or from the absorption/desorption fluids. Accordingly, a heat transfer sheet as previously described may be combined with the microporous contactor unit.

The pores are preferably as small as practical, on the order of a few microns, i.e. less than about 10 microns, and most preferably less than about 3 microns. The small pore size provides a strong resistance to a through-sheet velocity or pressure gradient. A cover is placed over the sheet having a fluid plenum that is less than about 10 microns in height from the sheet to the cover. Mass diffusion then occurs within a stagnant film and through the microporous contactor sheet. Micro-components may be manufactured on one or both sides of the microporous contactor sheet. Additionally, the microporous contactor sheet may have no microcomponents itself, but the cover sheet(s) may have microcomponents for directing fluid flow across the microporous contactor sheet. A further embodiment is simply a fluid microplenum on either side of the microporous contactor sheet.

The microporous contactor sheet may be made by micromachining a metal, ceramic or plastic by, for example Lithography, Galvanoformung (electrodeposition), Abformung (injection molding), or sintering. Advantages of micromachined contactor sheets include precise control of the pore size throughout the sheet.

In operation, fluids may flow in parallel, counterflow, or crossflow. The parallel flow results in lesser mass flux or extraction, but permits lesser pressure differential or gradient across the microporous sheet. When gas is one of the fluids and the gas is to be absorbed into a liquid, it is preferred that the gas pass through the microporous sheet, but not the liquid. Accordingly, it is preferred that the microporous sheet either be coated so that the liquid does not wet the microporous sheet or have pores sufficiently small so that the liquid is supported by its surface tension and does not flow through the pores.

In the case wherein a microporous sheet is not sufficiently self supporting between the covers, the covers may be made with projections or lands for support of the microporous sheet. Alternatively, as previously discussed, the microporous sheet may have grooves or microcomponents. In either case, projections or lands would support the microporous sheet.

A microporous contactor unit is shown in FIGS. 13. A microporous contactor sheet 1300 is placed between two covers 1302, 1304 each having a cover sheet 1306 and a distribution sheet 1308 that create microplena between the microporous contactor sheet 1300 and the cover sheets 1306 upon assembly. When used as an absorber, a gas is introduced into cover 1302 through inlet 1310. A weak solution enters the cover 1304 through inlet 1312 and the strong solution exits through outlet 1314. When used for solvent extraction, the solvent enters the cover 1302 at inlet 1310 and extract exits outlet 1316. Feed enters inlet 1312 and raffinate exits from outlet 1314. For either absorption or solvent extraction, if heat must be removed or added, a microchannel heat exchanger sheet 1318 may be used as shown. When used as a chemical reactor, specifically for partial oxidation of liquid organics, the gas is oxygen that passes through the microporous contactor sheet 1300.

EXAMPLE 3

An experiment was conducted to demonstrate separation in the form of gas absorption into a liquid. More specifically, ammonia vapor was absorbed into liquid water. A microporous contactor sheet made of sintered stainless steel having a nominal thickness of 4 mm (¹/₁₆ inch), average pore size of 2–5 micron and a porosity of from 30% to 50%. Cover sheets provided mictoplena having a thickness or distance from the microporous contactor sheet to the inside surface of the cover sheet (film thickness) ranging from about 100 to 300 microns. Within the liquid film on the microporous contactor, the ammonia was absorbed into the water. Ammonia flow rate varied from 0–4 g/min with water flow rate ranging from 0–33 g/min. Temperature ranged from 20°–60° C. for isothermal and adiabatic test runs. Absorption pressure was from 15 to 30 psia.

Figure 14:
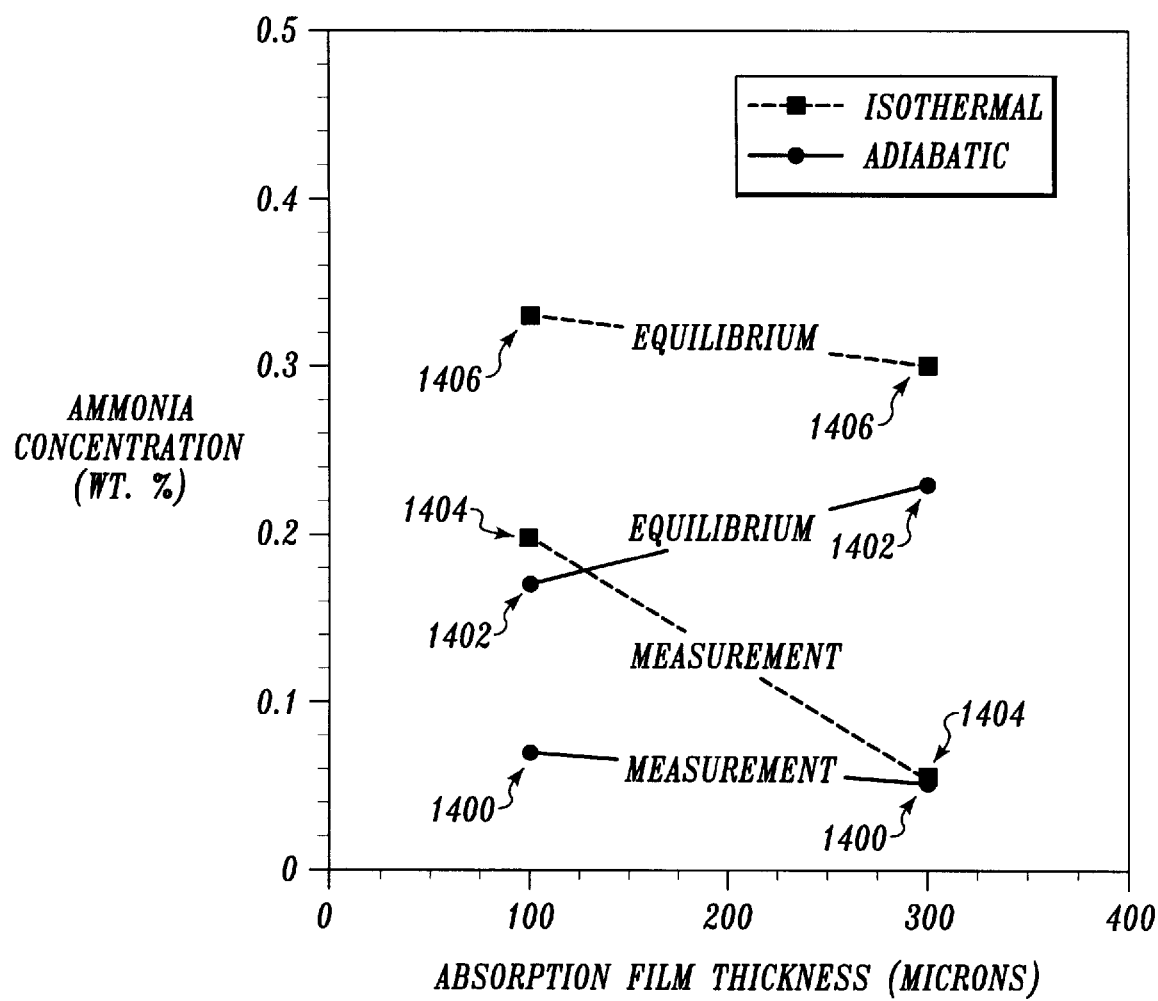
FIG. 14 is a graph of ammonia absorption versus absorption film thickness.

Results are shown in FIG. 14. Considering first the measured data for the adiabatic test, the points 1400 represent actual measurements of ammonia concentration at film thicknesses of 100 and 300 microns. The theoretical maximum absorption or "equilibrium" (which is a function of temperature) was calculated and represented by point 1402 for the adiabatic test. As the absorbtion film thickness is decreased, the measured ammonia concentration approaches the theoretical maximum.

Similar results are shown for the isothermal test represented by actual measurement points 1404 and equilibrium points 1406. Had the test been truly isothermal, the equilibrium line would have been horizontal. The slight slope of that line indicates a difference in temperature at the different film thicknesses.

Comparing the adiabatic data and the isothermal data, it is clear that greater absorption is achievable with heat removal (isothermal) than with no heat removal (adiabatic).

FUEL PROCESSING UNIT

For a power generation system, a fuel supply is necessary. In the case of a fuel cell, utilizing catalysts, the catalysts may be poisoned by carbon monoxide or other contaminants. Accordingly, a fuel processing unit may incorporate partial oxidation reactors, shift reactors (convert CO and $H_2O$ to additional $H_2$ and $CO_2$), a sulfur scrubber, a preferential oxidation reactor for removing remaining CO or a combination thereof. A fuel processing unit incorporating each of these features is shown in FIG. 15.

ADDITIONAL CHEMICAL PROCESSING APPLICATIONS

EXAMPLE 4

Figure 16A:
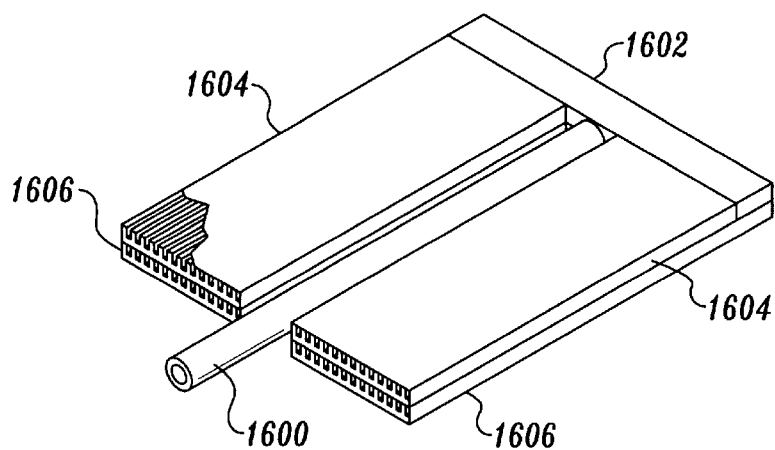
FIG. 16a is an isometric view of a combustor.

An experiment was conducted to demonstrate a combustion reactor using microchannel components as shown in FIG. 16a. Fuel and oxidizer enter a ceramic tube 1600. Ignition is accomplished with an electronic igniter (not shown). Combustion products pass through a header 1602 into gas flow laminates 1604. Water is passed through water flow laminates 1606.

The microchannels within the laminates 1604, 1606 were made with electro-discharge machining in stainless steel. Grooves were nominally 300 micrometers wide by 500 micrometers deep and 34 millimeters long. The area for heat transfer was 9.98 $cm^2$.

In this experiment, the fuel was methane and the oxidizer was oxygen. A mass flow ratio of precisely two moles of oxygen per mole of methane was maintained so that stoichiometric combustion occurred. Water flow rate was between about 1.28 g/s (1.6 gal/hr) and 1.32 g/s.

Figure 16B:
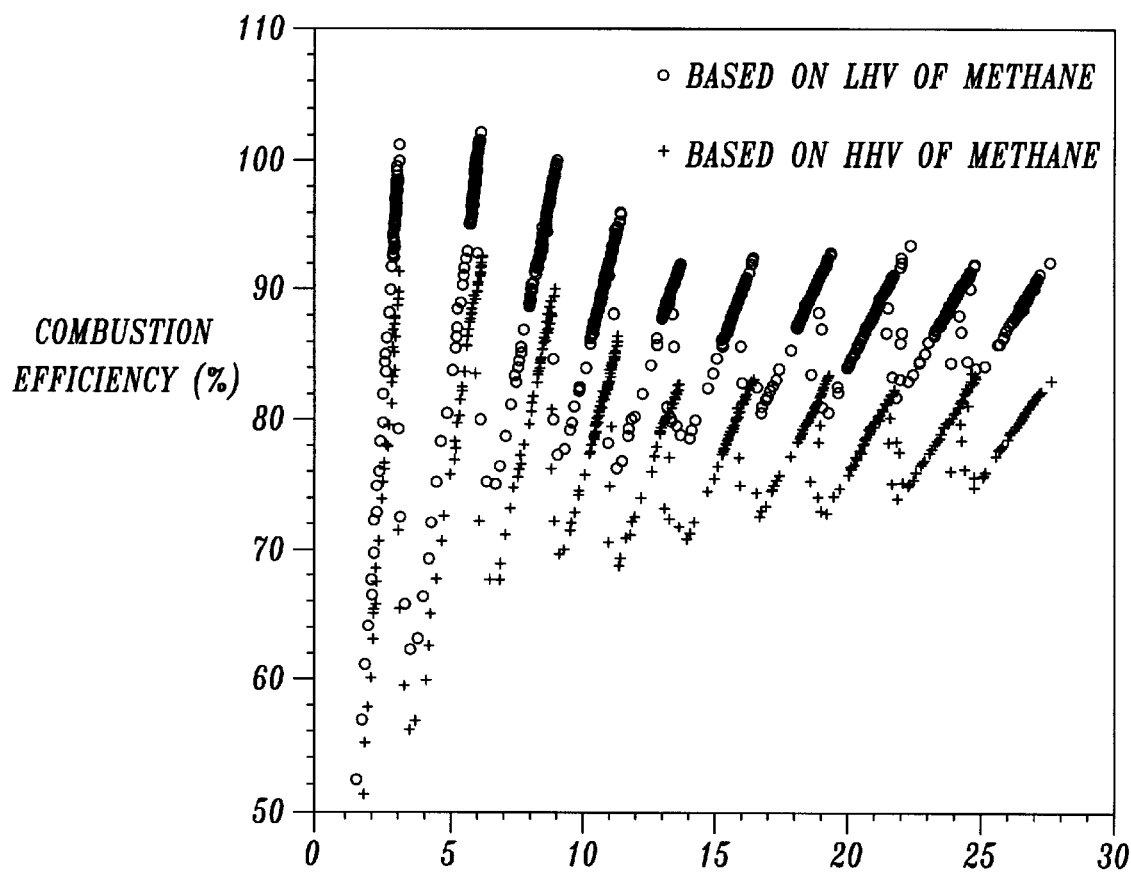
FIG. 16b is a graph of combustion efficiency versus heat rate for a combustor.

Results, in the form of combustion efficiency are shown in FIG. 16b. At low heat rates, the combustor efficiency is about 92% based upon the higher heating value (HHV) of the fuel. At heat rates above 15 $W/cm^2$, the combustion efficiency about 93% based upon the lower heating value (LHV) of the fuel or 85% based upon HHV.

CLOSURE

The fundamental structures and laminates are assembleable in numerous combinations of micro and macro components and corresponding unit operations, and permutations of microcomponents beyond those shown in the figures land discussed specifically herein. For example the two shown in FIG's 8 and 11 for partial oxidation and plasma processing, are exemplary but not exhaustive.

While preferred embodiments of the present invention have been shown and described, it will be apparent to those skilled in the art that many changes and modifications may be made without departing from the invention in its broader aspects. The skilled person would be able to apply preheating, intercooling, re-heating, combined cycles, chemical process unit operation(s) and other variations as has been done in macro systems. The appended claims are therefore intended to cover all such changes and modifications as fall within the true spirit and scope of the invention.

We claim:

1. A microcomponent sheet architecture, comprising:
   (a) a first laminate having a first plurality of microcomponents for performing at least one chemical process unit operation; attached to
   (b) a second laminate having a second plurality of microcomponents for performing at least one additional unit operation;
   (c) wherein the chemical process unit operation is combined with the additional unit operation and produces a system operation.

2. The microcomponent sheet architecture as recited in claim 1, wherein each of said first plurality of microcomponents further comprises:
   a plurality of first lands and flow paths.

3. The microcomponent sheet architecture as recited in claim 2, wherein each of said second plurality of microcomponents further comprises:
   a plurality of second lands and flow paths.

4. The microcomponent sheet architecture as recited in claim 3, wherein said first laminate receives chemical reactants, rejects chemical products and rejects or receives heat to or from said second laminate; and
   said first and second laminates are attached.

5. The microcomponent sheet architecture as recited in claim 4, wherein a fluid evaporates in said second laminate.

6. The microcomponent sheet architecture as recited in claim 4, further comprising:
   (a) a balance of plant attached to said second laminate;
   (b) thereby providing a power conversion system.

7. The microcomponent sheet architecture as recited in claim 2, further comprising:
   a coating of material on a surface of said flow paths.

8. The microcomponent sheet architecture as recited in claim 7, wherein said coating material is a catalyst.

9. The microcomponent sheet architecture as recited in claim 7, wherein said coating material is a conductive material deposited on a bottom surface of each of said flow paths.

10. The microcomponent sheet architecture as recited in claim 9, wherein said coating material further comprises a dielectric material over said conductive material.

11. The microcomponent sheet architecture as recited in claim 4, wherein said first laminate is in a cross flow relationship to said second laminate, whereby a temperature gradient along a flow direction of the first laminate is maintained.

12. The microcomponent sheet architecture as recited in claim 1, further comprising:
   a field generator in proximity to said first laminate for inducing or controlling said chemical reaction(s) therein.

13. The microcomponent sheet architecture as recited in claim 3, wherein said first laminate receives chemical reactants and rejects chemical products;
   wherein said second laminate provides at least one unit operation other than heat transfer; and
   said first and second laminates are attached.

14. The microcomponent sheet architecture as recited in claim 3, further comprising a microporous sheet contactor placed between said first and second laminates such that said microchannels are facing said microporous sheet contactor.

15. A microcomponent sheet architecture, comprising:
   (a) a first laminate having a first portion and a second portion, the first portion having a first plurality of microcomponents for performing at least a chemical process unit operation and the second portion having a second plurality of microcomponents for performing at least another unit operation;
   wherein the chemical process unit operation is combined with the additional unit operation and produces a system operation.

16. The microcomponent sheet architecture as recited in claim 15, wherein each of said first plurality of microcomponents further comprises:
   a plurality of lands and flow paths.

17. The microcomponent sheet architecture as recited in claim 16, wherein each of said second plurality of microcomponents further comprises:
   a second plurality of lands and flow paths.

18. The microcomponent sheet architecture as recited in claim 17, wherein said first laminate, first portion receives reactants and rejects products and said first laminate, second portion extracts work or heat from the products.

19. The microcomponent sheet architecture as recited in claim 18, wherein a second laminate having a first portion that rejects heat and said second laminate, second portion that both compresses the fluid and rejects heat thereby approaching an ideal Brayton Cycle machine.

20. The microcomponent sheet architecture as recited in claim 15, further comprising:
   a coating of material within said first plurality of microcomponents.

21. The microcomponent sheet architecture as recited in claim 20 wherein said coating material is a catalyst.

22. The microcomponent sheet architecture as recited in claim 20, wherein said coating material is a conductive material deposited on a bottom surface of each of said flow paths.

23. The microcomponent sheet architecture as recited in claim 22, wherein said coating material further comprises a dielectric material over said conductive material.

24. The microcomponent sheet architecture as recited in claim 17, further comprising a microporous sheet contactor placed between said first laminate and a cover sheet such that said microchannels are facing said microporous sheet contactor.

25. A microcomponent sheet architecture, comprising:
   (a) a first laminate having a first plurality of microcomponents for performing at least one exothermic chemical reaction unit operation; attached to
   (b) a unit requiring heat input; which is attached to
   (c) a balance of plant, thereby providing a power generation system.

26. A microcomponent sheet architecture, comprising:
   (a) a first laminate that is microporous and having a first plurality of microchannels for performing at least one chemical process unit operation; attached to
   (b) a second laminate having a second plurality of microchannels for performing at least one additional unit operation;
   (c) wherein the chemical process unit operation is combined with the additional unit operation and produces a system operation.

27. The microaomponent sheet architecture as recited in claim 26, wherein said first laminate receives chemical reactants, rejects chemical products and rejects or receives heat to or from said second laminate; and said first and second laminates are attached.

28. The microcomponent sheet architecture as recited in claim 26, wherein a fluid evaporates in said second laminate.

29. The microcomponent sheet architecture as recited in claim 26, further comprising:

(a) a balance of plant attached to said second laminate;

(b) thereby providing a power conversion system.

30. The microcomponent sheet architecture as recited in claim 26, further comprising:

a coating of material on a surface of said microchannels.

31. The microcomponent sheet architecture as recited in claim 30, wherein said coating material is a catalyst.

32. The microcomponent sheet architecture as recited in claim 30, wherein said coating material is a conductive material deposited on a bottom surface of each of said flow paths.

33. The microcomponent sheet architecture as recited in claim 32, wherein said coating material further comprises a dielectric material over said conductive material.

34. The microcomponent sheet architecture as recited in claim 26, wherein said first laminate is in a cross flow relationship to said second laminate, whereby a temperature gradient along a flow direction of the first laminate is maintained.

35. The microcomponent sheet architecture as recited in claim 26, further comprising:

a field generator in proximity to said first laminate for inducing or controlling said chemical reaction(s) therein.

36. The microcomponent sheet architecture as recited in claim 7, wherein said coating material is a membrane.

37. The microcomponent sheet architecture as recited in claim 7, wherein said coating material is an adsorbent.

38. The microcomponent sheet architecture as recited in claim 30, wherein said coating material is an adsorbent.

39. The microcomponent sheet architecture as recited in claim 30, wherein said coating is a membrane.

40. The microcomponent sheet architecture as recited in claim 14, wherein said at least one chemical process unit operation is selected from the group consisting of (a) a gas absorbed within a liquid on opposite sides of said contactor sheet, (b) said gas evolved from said liquid on opposite sides of said contactor sheet, (c) a solvent extraction between said liquid and a second liquid on opposite sides of said contactor sheet.

41. The microcomponent sheet architecture as recited in claim 24, wherein said at least one chemical process unit operation is selected from the group consisting of (a) a gas absorbed within a liquid on opposite sides of said contactor sheet, (b) said gas evolved from said liquid on opposite sides of said contactor sheet, (c) a solvent extraction between said liquid and a second liquid on opposite sides of said contactor sheet.

* * * * *